United States Patent [19]
Okamura

[11] Patent Number: 5,660,881
[45] Date of Patent: Aug. 26, 1997

[54] METHOD OF MANUFACTURING CVD DIAMOND COATED CUTTING TOOLS

[75] Inventor: Toshihiko Okamura, Ishige-machi, Japan

[73] Assignee: Mitsubishi Materials Corporation, Tokyo, Japan

[21] Appl. No.: 470,468

[22] Filed: Jun. 6, 1995

Related U.S. Application Data

[62] Division of Ser. No. 195,835, Feb. 14, 1994, Pat. No. 5,618,625, which is a continuation of Ser. No. 838,938, Feb. 21, 1992, abandoned.

[30] Foreign Application Priority Data

Feb. 21, 1991 [JP] Japan ..................... 3-49099

[51] Int. Cl.$^6$ .................. C23C 16/26; C22C 1/05; B22F 3/14; B23P 5/00
[52] U.S. Cl. .................. 427/249; 427/309; 427/560; 51/307; 407/119; 419/49
[58] Field of Search ............... 427/249, 309, 427/560; 51/307; 407/119; 428/408; 419/49

[56] References Cited

U.S. PATENT DOCUMENTS 4,731,296  3/1988  Kikuchi et al. .

FOREIGN PATENT DOCUMENTS

0374923A2  6/1990  European Pat. Off. .
1-119671   5/1989  Japan .
2-4932     1/1990  Japan .
2-4933     1/1990  Japan .

Primary Examiner—Roy V. King
Attorney, Agent, or Firm—Oblon, Spivak, McClelland, Maier & Neustadt, P.C.

[57] ABSTRACT

This invention presents diamond coated tool member of high toughness exhibiting excellent diamond adhesion to the substrate. The green compacts of the usual Co and WC composition are subjected to primary sintering in a vacuum or in an inert gas atmosphere, followed by secondary sintering in a vacuum or in an inert gas atmosphere at a pressure in the range of 10–200 atmospheres at a temperature between the liquid formation temperature of Co and 1,500° C. The as-sintered surfaces are subjected to chemical etching, followed by fine polishing in an ultrasonic bath held at room temperature or a temperature just below the boiling point. The cutting tool substrate having the polished surface is placed in a CVD reactor to deposit a diamond coating. The concentration profile of Co in the diamond coated tool member hus formed has a Co-deficient layer and a Co-gradient layer. The Co-deficient layer assures good adhesion of diamond coating to the cutting tool substrate and the regular Co concentration in the interior of the cutting tool substrate assures high toughness.

13 Claims, 2 Drawing Sheets

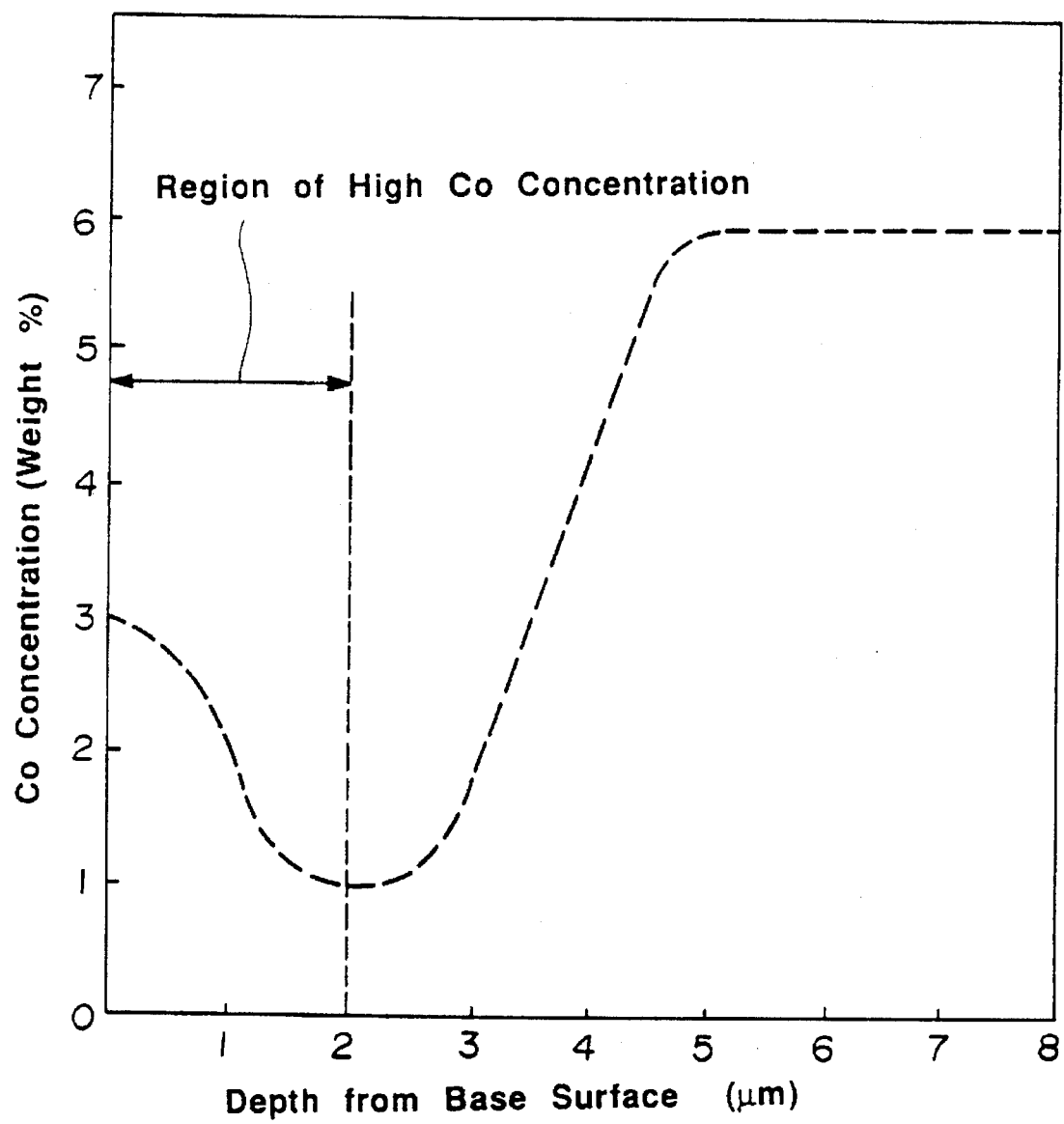

METHOD OF MANUFACTURING CVD DIAMOND COATED CUTTING TOOLS

This is a division, of application Ser. No. 08/195,835, filed on Feb. 14, 1994, now U.S. Pat. No. 5,618,625 which is a continuation of application Ser. No. 07/838,938, filed on Feb. 21, 1992, abandoned.

BACKGROUND OF THE INVENTION

This invention relates to cutting tool member with a diamond coating, and a method of producing such tool member by a method of chemical vapor deposition.

In recent years, diamond coated tool member for machining aluminum and aluminum alloys have become available. In such diamond coated member, the substrate base is tungsten carbide (referred to as WC hereinafter) contains primarily WC with one or two other carbides of 4B, 5B or 6B group metals and associated impurities, and the WC powders are sintered using Co or Ni as a binder phase. The diamond coating on such a substrate base is susceptible to separation from the substrate, thus shortening their service life. Therefore, there are many attempts at improving the adhesion strength between the diamond coating and the substrate based cemented carbide.

For example, a Japanese patent application (JPA First Publication No. S63-14869) discloses a method of improving the adhesion strength, by depositing diamond coating on the surface of the substrate based cemented carbide which has been chemically etched to remove Co from the substrate so as to make the particles of WC protrude out about 0.05 to 0.5 μm from the surface of the substrate.

Another patent application (JPA First Publication H1-246361) discloses a method of removing the Co (from a WC substrate base having an as-sintered surface sintered in a vacuum atmosphere or WC base whose surface has been machined off) by subjecting the surface to vacuum heating at temperatures above the liquid phase formation temperature of Co, and further chemical etching treatment is applied to remove the melted Co particles, and depositing diamond on the chemically treated surface.

However, the bonding strength of the diamond coatings to the base obtained by the techniques disclosed above is not sufficient for practical purposes. The present inventors studied the reasons for the adhesion problems, and discovered that, in the diamond coatings produced by the above techniques, there is a concentrated region of Co near the interface between the coating and the substrate. It has been demonstrated in the present invention that the high concentration of Co at the interface between the diamond coating and the WC based semented carbide substrate is responsible for poor adhesion.

SUMMARY OF THE INVENTION

The objectives of the present invention are to resolve such problems of weak bonding strength existing in the diamond coated cutting tool member made by the current coating technology, and to provide diamond coated cutting tool of WC based semented carbide substrate having both a long machining service life and high toughness.

The results of intensive R&D efforts have demonstrated that cutting tool member satisfying the above objectives are produced under the following conditions.

The starting materials are Co and WC powders of average particle diameter in the range of 5–10 μm. The powders are blended to produce a mixture having a composition 4–20 weight %, and the remainder consisting of WC and unavoidable impurities. The powder mixture is molded in a press to make green compacts, which are subjected to primary sintering in a vacuum or in a low pressure inert gas atmosphere to produce primary sintered substrate. The primary sintered substrate is subjected to secondary sintering in a vacuum or in an inert gas atmosphere at a pressure in the range of 5–1,000 atmospheres, preferably in the range of 10–200 atmospheres at a temperature between the liquid formation temperature and 1,500° C.

The as-sintered surfaces of the tool substrate produced by the secondary sintered process are subjected to chemical etching, and are further subjected to fine polishing in an ultrasonic bath held at room temperature or a temperature just below the boiling point of the liquid so that it can be readily brought to a boil. The tool substrate having the polished surface is placed in a CVD reactor to deposit a diamond coating on the surfaces thereof.

The concentration profile of Co in the diamond coated cutting tool member thus formed has the features, shown in FIG. 1. The surface of the tool substrate adjacent to the diamond coating below is termed a Co-deficient layer. It is less than 5 μm and the concentration of Co in the layer is less than 1 weight percent. The adjacent interior layer to the Co-deficient layer is termed a Co-gradient layer, and it has less than 10 μm thickness and the concentration of Co increases from a low value at the interface (between the Co-deficient layer and the Co-gradient layer) to a higher value in the interior of the (tool) substrate. An important feature of the present invention is that the diamond coating is formed on top of the Co-deficient layer of a WC substrate whose Co concentration is comparatively very low, thereby assuring a high bonding strength between the diamond coating and the tool base, but retaining the high toughness interior properties of the original WC based cemented carbide substrate.

BRIEF EXPLANATION OF THE DRAWINGS

FIG. 2 shows the concentration gradient of Co in a conventional CVD diamond coated cutting tool member.

PREFERRED EMBODIMENTS OF THE INVENTION

Figure 1:
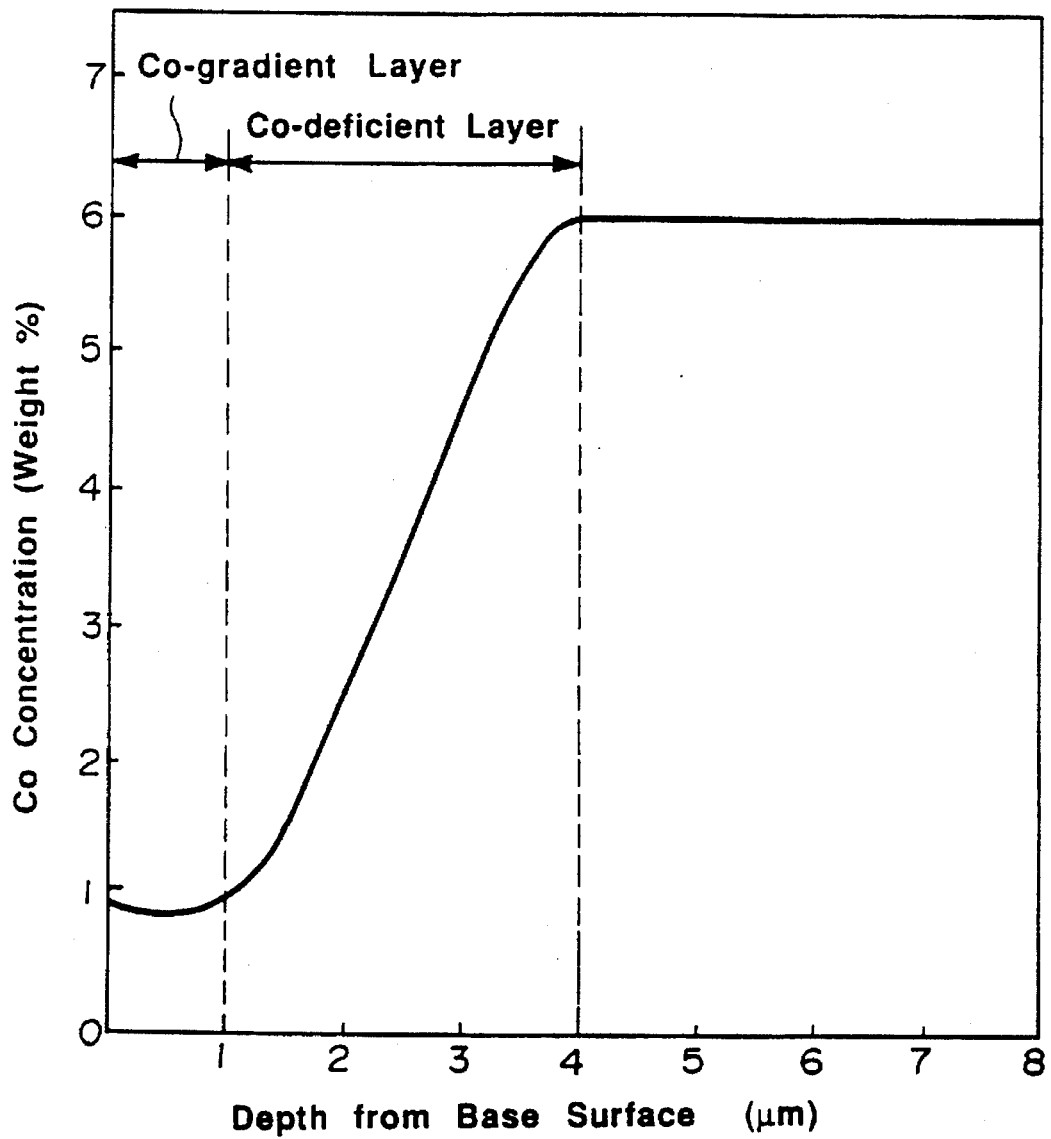
FIG. 1 shows the distribution of Co concentration in a CVD diamond coated tool member of the present invention.

The starting material powders were prepared according to the following conditions: WC and Co particles having the average particle size in the range of 0.5–10 μm were mixed in a ratio of 4–20 weight % Co powder and the remainder WC powder and unavoidable impurities. The mixture was pressed into compacts, and they were given primary sintering in a vacuum or in a low pressure inert gas atmosphere. Conventional cutting tool member were prepared by grinding the surface of such sintered tool member The sintered tool member were further processed under pressure of 5 to 1,000 atmospheres (preferred range of 10 to 200) of inert gas environment at temperatures in excess of the Co liquid formation temperature but less than 1,500° C., termed secondary sintering, to produce a (tool) substrate of the present invention. The as-sintered surface of the (tool) substrate thus obtained was chemically etched using a conventional aqueous solution of 5% nitric acid. The protrusions on the etched surface were further processed in an ultrasonic polishing bath, containing a dispersion of fine particles of a hard substance in a polishing liquid held at room temperature or just below its boiling temperature. The (tool) substrate with the ultrasonically polished surface was then subjected to a CVD deposition process, by which process a diamond coating was formed on the (tool) substrate.

FIG. 1 shows the Co concentration profile near the interface region between the (tool) substrate and the diamond coating. There is a Co-deficient layer of less than 5 μm thickness, in which the Co concentration at the (tool) substrate/coating interface is less than 1 weight %, and a Co-gradient layer of less than 10 μm thickness in which the Co concentration increases gradually toward the interior from a low value at the interface to a high value in the interior of the (tool) substrate. It is noted that the diamond deposit is made on the surface of the Co-deficient layer having relatively very low concentration of Co. It was observed that the bonding strength was excellent, and the tool member retained excellent toughness expected of the WC based semented carbide substrate.

Detailed examination of the cross section of the etched (tool) substrate indicated that the chemical etching step removed Co from the surface of the substrate to the depth of from 3 to 15 μm. The protrusions at the (tool) substrate surface thus prepared are polished in the ultrasonic polishing bath containing, for example, diamond particles of average particle size of 10 μm. The polishing step is carried out at room temperature or just below the boiling point of the bath liquid but is in a condition ready for a boil. When the bath is in such a condition, the liquid boils upon the application of ultrasonic energy, and the polishing efficiency is greatly improved. It was observed further that the addition of a surfactant improved the polishing efficiency even further.

It was observed that the bonding strength was excellent between the CVD diamond deposit on such polished surfaces having the Co concentration of less than 1 weight % at the interface, and having a concentration gradient in a layer of less than 4 μm. The (tool) substrate retained excellent toughness also. When the Co concentration exceeded 1 weight %, the bonding strength decreased, and when the Co-deficient layer thickness increased beyond 1 μm, the cutting tool member became susceptible to chipping, and when the Co-gradient layer became thicker than 4 μm, the tool substrate became susceptible to deformation during machining.

Although, this embodiment was explained in terms of the Co concentration profile shown in FIG. 1, it should be noted that the invention is not bound by this particular shape of profile. Composition profiles are governed by processing variables, and the important concept is the presence of: a Co-deficient region next to the diamond deposit; and a Co-gradient region in the interior of the (tool) substrate to provide toughness.

EXAMPLES

The specific technical merits of the above embodiment are demonstrated by the actual experimental results discussed below and shown in Tables 1 to 3.

The starting material powders, consisting of WC powder, TiC powder (Ti and Ta of similar sizes were also used), C powder and Co powders had average particle diameters of 0.7 to 0.9 μm. These starting material powders were blended with each other into the compositions given in Tables 1 to 3. These constituent powders were wet ground and mixed in a ball mill for 72 hours. After drying, the mixed powder was placed in a mold and pressed into green compacts at a pressure of 1.5 tons/cm2. The primary sintering was performed at the aforementioned temperature to produce conventional WC based semented carbide having approximately the same compositions shown in Tables 1 to 3. The surfaces of these substrates were ground to produce cutting insert substrates to conform to the specifications in SPGN 120308 of the ISO standard. The secondary sintering was performed according to the conditions shown in Tables 1 to 3, after which the cutting insert substrate were etched in an aqueous solution containing 5% nitric acid. The cutting insert substrate were polished by immersing them in an aqueous solution of alkylsulfonic acid containing dispersed diamond particles of average particle diameter 10 μm, at a temperature of 65° C., and activating the surface by applying ultrasonic agitation at 1 MHz.

The polished tool base was placed in a CVD reactor under the following conditions:

| Reactor pressure | 30 Torr |
|---|---|
| Base Temperature | 750° C. |
| Reaction gases | methane/hydrogen ratio = 1 |
| Reaction time | 24 hours |

The CVD reaction produced diamond deposits having an average thickness of about 3 μm on the (tool) cutting insert substrate. These are shown in diamond coated cutting insert examples 1–27, along with comparative examples 1–9, in Table 1 to 3. The tables also show the details of the Co-deficient layer and the Co-gradient layer. Further, for comparative evaluation purpose, conventional diamond coated inserts 1–3 were prepared by the steps of: sintering WC based semented carbide insert in a vacuum as in the conventional treatment, grinding the surface, further heat treatment at 1350° to 1400° C. in a vacuum, chemically etching the surface, washed in ultrasonic bath in the conventional way, and formed CVD diamond deposit on the cleaned surface according to the conditions specified in Tables 1 to 3.

Dry turning performance was evaluated under the following conditions:

| Workpiece | Al/Si alloy of 12% Si |
|---|---|
| Cutting speed, V | 1,000 m/min |
| Depth of cut, d | 3.0 mm |
| Feed rate, f | 0.2 mm/rev |

Wet milling performance was also evaluated under the following conditions:

| Workpiece | Al/Si alloy of 12% Si |
|---|---|
| Cutting speed, V | 1,200 m/min |
| Depth of cut, d | 1.5 mm |
| Feed rate, Sz | 0.2 mm/tooth |

The criterion of performance was based on the duration of time in which the cutting insert substrates continued to produce smooth machined surfaces without visible peeling off of the diamond coating. The results are shown also in Tables 1 to 3.

TABLE 1

| Sample Nos. | Composition (weghit %) | Secondary Sintering | | | Co Distribution | | | Performance Time Period | |
|---|---|---|---|---|---|---|---|---|---|
| | | Temperature and Atmosphere | Pressure (Atm) | Holding Time (min) | Co-Det. (weight %) | Co-Def. Layer Thickness (μm) | Co-Grad. Layer Thickness (μm) | turning Test | Mill Test |
| Present Invention | | | | | | | | | |
| 1 | Co powder: 6 | 1400° C. | 5 | 60 | 0.8 | 0.2 | 2.8 | 60 | 58 |
| 2 | WC powder: 94 | Ar gas | 100 | 60 | 0.8 | 2.0 | 8.0 | 61 | 56 |
| 3 | | atmos. | 200 | 60 | 0.8 | 0.1 | 3.3 | 65 | 50 |
| 4 | | | 100 | 60 | 1.0 | 5.0 | 10.0 | 59 | 58 |
| 5 | | | 100 | 60 | 0.5 | 1.0 | 3.2 | 63 | 57 |
| 6 | | | 100 | 60 | 0.2 | 0.1 | 2.4 | 64 | 55 |
| 7 | | | 1000 | 60 | 0.1 | 0.2 | 3.8 | 66 | 52 |
| 8 | | | 50 | 60 | 0.1 | 0.8 | 5.0 | 68 | 49 |
| 9 | | | 50 | 60 | 0.3 | 0.05 | 3.0 | 60 | 59 |
| Comparison | | | | | | | | | |
| 1 | | | 5 | 30 | 0.1 | 0.1 | 15* | 15 | 1 |
| 2 | | | 1* | 30 | 3.5* | — | 2 | 7 | 3 |
| 3 | | | 1200* | 5 | 0.5 | 8* | 20* | 15 | 1 |
| Conventional | | | | | | | | | |
| 1 | | 1400° C. vac. atmos. | 1×10⁻³ (Torr) | 90 | 3.0 | — | 5 | 10 | 5 |

*Indicates conditions outside the range of present invention

TABLE 2

| Sample Nos. | Composition (weghit %) | Secondary Sintering | | | Co Distribution | | | Performance Time Period | |
|---|---|---|---|---|---|---|---|---|---|
| | | Temperature and Atmosphere | Pressure (Atm) | Holding Time (min) | Co-Det. (weight %) | Co-Def. Layer Thickness (μm) | Co-Grad. Layer Thickness (μm) | turning Test | Mill Test |
| Present Invention | | | | | | | | | |
| 10 | Co powder: 5.8 | 1400° C. | 5 | 60 | 0.8 | 0.2 | 2.8 | 59 | 56 |
| 11 | TiC powder: 1 | Ar gas | 100 | 60 | 0.9 | 1.9 | 7.8 | 60 | 58 |
| 12 | WC powder: 94.2 | atmos. | 200 | 60 | 0.9 | 0.1 | 3.3 | 65 | 62 |
| 13 | | | 100 | 60 | 1.1 | 5.0 | 9.8 | 58 | 55 |
| 14 | | | 100 | 60 | 0.5 | 1.0 | 2.3 | 64 | 60 |
| 15 | | | 100 | 60 | 0.2 | 0.1 | 3.0 | 65 | 63 |
| 16 | | | 1000 | 60 | 0.1 | 0.2 | 3.8 | 65 | 63 |
| 17 | | | 50 | 60 | 0.2 | 0.7 | 4.8 | 63 | 60 |
| 18 | | | 50 | 60 | 0.4 | 0.04 | 2.9 | 59 | 58 |
| Comparison | | | | | | | | | |
| 4 | | | 5 | 30 | 0.2 | 0.09 | 15* | 13 | 2 |
| 5 | | | 1* | 30 | 3.6* | — | 1.8 | 6 | 4 |
| 6 | | | 1200* | 5 | 0.5 | 7.9* | 18* | 11 | 2 |
| Conventional | | | | | | | | | |
| 2 | | 1400° C. vac. | 1×10⁻³ (Torr) | 90 | 3.1 | — | 5 | 9 | 4 |

*Indicates conditions outside the range of present invention

TABLE 3

| Sample Nos. | Composition (weghit %) | Secondary Sintering Temperature and Atmosphere | Secondary Sintering Pressure (Atm) | Secondary Sintering Holding Time (min) | Co Distribution Co-Det. (weight %) | Co Distribution Co-Def. Layer Thickness (μm) | Co Distribution Co-Grad. Layer Thickness (μm) | Performance Time Period turning Test | Performance Time Period Mill Test |
|---|---|---|---|---|---|---|---|---|---|
| Present Invention | | | | | | | | | |
| 19 | Co powder: 8 | 1350° C. | 5 | 60 | 1.0 | 0.2 | 2.8 | 59 | 56 |
| 20 | (Ti, Ta)C | Ar gas | 100 | 60 | 1.0 | 2.0 | 7.8 | 60 | 58 |
| 21 | powder: 10 | atmos. | 200 | 60 | 1.0 | 0.2 | 3.3 | 65 | 62 |
| 22 | WC powder: 82 | | 100 | 60 | 1.2 | 5.0 | 9.8 | 58 | 55 |
| 23 | | | 100 | 60 | 0.6 | 0.1 | 2.3 | 64 | 60 |
| 24 | | | 100 | 60 | 0.3 | 0.1 | 3.0 | 65 | 63 |
| 25 | | | 1000 | 60 | 0.1 | 0.2 | 3.8 | 65 | 63 |
| 26 | | | 50 | 60 | 0.2 | 0.6 | 4.8 | 63 | 60 |
| 27 | | | 50 | 60 | 0.4 | 0.04 | 2.9 | 59 | 58 |
| Comparison | | | | | | | | | |
| 7 | | | 5 | 30 | 0.4 | 0.08 | 15* | 13 | 2 |
| 8 | | | 1* | 30 | 3.7* | — | 1.8 | 6 | 4 |
| 9 | | | 1200* | 5 | 0.8 | 7.8* | 18* | 11 | 2 |
| Conventional | | | | | | | | | |
| 3 | | 1350° C. vac. atmos. | 1×10⁻³ (Torr) | 90 | 3.2 | — | 5 | 9 | 4 |

*Indicates conditions outside the range of present invention

What is claimed is:

1. A process for making a CVD diamond coated cutting tool comprising the steps of:

forming a green compact by pressing a powder mixture comprising 4 to 20 wt % Co with the remainder being WC powder;

forming a sintered body by performing a primary sintering on said green compact;

making a primary WC-based cemented carbide substrate for the CVD diamond coated cutting tool by grinding said sintered body into a given shape;

making a WC-based cemented carbide substrate for the CVD diamond coated cutting tool by performing a secondary sintering on said primary-WC-based cemented carbide substrate in an inert gas environment at a pressure of 5 to 1000 atmospheres and a temperature between the liquid phase formation temperature of Co and 1500° C.;

chemically etching said WC-based cemented carbide substrate;

performing an ultrasonic agitation on said WC-based cemented carbide substrate; and forming a diamond coating layer on the surface of said WC-based cemented carbide substrate by a CVD process;

wherein said WC-based cemented carbide substrate comprises;

a Co-deficient layer having a thickness of from 0.05 to 5 μm from the surface of the WC-based cemented carbide substrate on which the CVD diamond coating layer is formed wherein the Co concentration is not more than 1 wt %; and a Co-gradient layer, having a thickness of from 2.4 to 10 μm, wherein the Co concentration gradually increases in going from said co-deficient layer towards the interior of said WC-based cemented carbide substrate.

2. A process for making a CVD diamond coated cutting tool in accordance with claim 1, wherein said powder mixture has an average grain size of between 0.5 and 10 μm.

3. A process for making a CVD diamond coated cutting tool in accordance with claim 1, wherein the surface of said WC-based cemented carbide substrate is chemically etched after said secondary sintering without polishing.

4. A process for making a CVD diamond coated cutting tool in accordance with claim 1, wherein an ultrasonic agitation is performed on said WC-based-cemented carbide substrate, after chemical etching, in a solvent wherein particles are freely dispersed.

5. A process for making a CVD diamond coated cutting tool in accordance with claim 4, wherein said particles comprise diamond particles having an average grain size of 10 μm.

6. A process for making a CVD diamond coated cutting tool in accordance with claim 1, wherein the pressure of said inert gas environment during secondary sintering is in the range of 10 to 20 atmospheres.

7. A process for making a CVD diamond coated cutting tool comprising the steps of:

forming a green compact by pressing a powder mixture comprising 4 to 20 wt % Co with the remainder being made up of a WC-based carbide powder comprising WC powder and/or at least one carbide of a metal selected from the group consisting of Groups 4B, 5B, and 6B metals in the periodic table;

forming a sintered body by performing a primary sintering on said green compact;

making a primary WC-based cemented carbide substrate for the CVD diamond coated cutting tool by grinding said sintered body into a given shape;

making a WC-based cemented carbide substrate for the CVD diamond coated cutting tool by performing a secondary sintering on said primary WC-based cemented carbide substrate in an inert gas environment at a pressure of 5 to 1000 atmospheres and a temperature between the liquid phase formation temperature of Co and 1500° C.;

chemically etching said WC-based cemented carbide substrate;

performing an ultrasonic agitation on said WC-based cemented carbide substrate; and forming a diamond coating layer on the surface of said WC-based cemented carbide substrate by a CVD process, wherein said green compact comprises 4 to 20 wt % Co, tungsten carbide, and at least one carbide compound selected from the group consisting of carbides of Group 4B, 5B, and 6B metals, and wherein said WC-based cemented carbide substrate comprises:

a Co-deficient layer having a thickness of from 0.04 to 5 μm from the surface of the WC-based cemented carbide substrate on which the CVD diamond coating layer is formed wherein the Co concentration is not more than 1.2% wt % Co; and a Co-gradient layer having a thickness of from 2.3 to 9.8 μm, wherein the Co concentration gradually increases in going from said Co-deficient layer toward the interior of said WC-based cemented carbide substrate.

8. A process for making a CVD diamond coated cutting tool in accordance with claim 7, wherein said powder mixture is a mixture of WC powder and Co powder having an average grain size of between 0.5 to 10 μm and/or at least one carbide of a metal selected from the group consisting of Groups 4B, 5B, and 6B metals in the periodic table.

9. A process for making a CVD diamond coated cutting tool in accordance with claim 7, wherein at least one carbide powder selected from the group consisting of Tic and (Ti, Ta)C powder is used as said carbide of a metal selected from the group consisting o Group, 4B, 5B, and 6B metals in the periodic table.

10. A process for making a CVD diamond coated cutting tool in accordance with claim 7, wherein the surface of said WC-based cemented carbide substrate is chemically etched after said secondary sintering without polishing.

11. A process for making a CVD diamond coated cutting tool in accordance with claim 7, wherein an ultrasonic agitation is performed on said WC-based cemented carbide substrate, after etching, in a solvent wherein particles are freely disperse.

12. A process for making a CVD diamond coated cutting tool in accordance with claim 11, wherein said particles comprise diamond particles having an average grain size of 10 μm.

13. A process for making a CVD diamond coated cutting tool in accordance with claim 7, wherein the pressure of said inert gas environment during secondary sintering is in the range of 10 to 20 atmospheres.

* * * * *